US 8,392,867 B2

(12) United States Patent
Deng et al.

(10) Patent No.: US 8,392,867 B2
(45) Date of Patent: Mar. 5, 2013

(54) SYSTEM, METHOD AND PROGRAM STORAGE DEVICE FOR DEVELOPING CONDENSED NETLISTS REPRESENTATIVE OF GROUPS OF ACTIVE DEVICES IN AN INTEGRATED CIRCUIT AND FOR MODELING THE PERFORMANCE OF THE INTEGRATED CIRCUIT BASED ON THE CONDENSED NETLISTS

(75) Inventors: Yanqing Deng, South Burlington, VT (US); Paul A. Hyde, Essex Junction, VT (US); James M. Johnson, Milton, VT (US); Todd G. McKenzie, Essex Junction, VT (US); Scott K. Springer, Burlington, VT (US); Richard Q. Williams, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 199 days.

(21) Appl. No.: 13/005,599

(22) Filed: Jan. 13, 2011

(65) Prior Publication Data
US 2012/0185812 A1   Jul. 19, 2012

(51) Int. Cl.
*G06F 17/50* (2006.01)
(52) U.S. Cl. .................. 716/136; 716/111; 716/112
(58) Field of Classification Search .......... 716/100, 716/101, 105, 106, 136, 111, 112
See application file for complete search history.

(56) References Cited

U.S. PATENT DOCUMENTS

| 5,828,580 | A | 10/1998 | Ho |
| 5,903,469 | A | 5/1999 | Ho |
| 5,999,726 | A | 12/1999 | Ho |
| 6,128,768 | A | 10/2000 | Ho |
| 6,134,513 | A | 10/2000 | Gopal |
| 6,182,269 | B1 | 1/2001 | Laubhan |
| 6,219,630 | B1 | 4/2001 | Yonezawa et al. |
| 6,289,116 | B1 * | 9/2001 | Chamberlain et al. ........ 382/141 |
| 6,421,814 | B1 | 7/2002 | Ho |
| 6,438,729 | B1 | 8/2002 | Ho |
| 6,519,752 | B1 | 2/2003 | Bakker et al. |

(Continued)

OTHER PUBLICATIONS

Silvant, "Validating netlist reduction, circuit extraction," EE Times India, Jan. 15, 2010, pp. 1-3, http://www.eetindia.co.in/STATIC/PDF/201001/EEIOL_2010JAN15_EDA_TA_01.pdf?SOURCES=DOWNLOAD.

(Continued)

*Primary Examiner* — Sun Lin
(74) *Attorney, Agent, or Firm* — Gibb & Riley, LLC; Michael J. LeStrange, Esq.

(57) ABSTRACT

A system and method for developing condensed netlists for sub-circuits within an integrated circuit and for modeling the performance of the integrated circuit based on the condensed netlists rather than full netlists. An IC layout is segmented into a plurality of sub-circuits, each comprising a group of one or more of a given type of active devices connected to (i.e., sharing) the same electrical sub-circuit terminals through a similar resistive network (i.e. such that they are subjected to approximately the same overall combined parasitic resistances). Full netlists corresponding to the sub-circuits are extracted from the layout and condensed. Each condensed netlist accounts for performance variations (e.g., as a function of variations in operating power supply voltages, operating temperatures and, optionally, self-heating and/or stress) exhibited by the active devices and resistive network in a sub-circuit. The condensed netlists for the sub-circuits are then simulated over the full range of operating temperatures and full range of operating power supply voltages for the integrated circuit in order to generate a performance model for the integrated circuit.

25 Claims, 6 Drawing Sheets

U.S. PATENT DOCUMENTS

| | | |
|---|---|---|
| 6,671,862 B1 | 12/2003 | Seward |
| 6,704,911 B2 | 3/2004 | Yang |
| 6,763,504 B2 | 7/2004 | Rao et al. |
| 7,003,753 B2 | 2/2006 | Teene |
| 7,134,103 B2 | 11/2006 | Beattie et al. |
| 7,139,990 B2 | 11/2006 | Singh et al. |
| 7,159,202 B2 | 1/2007 | Lee et al. |
| 7,487,473 B2 | 2/2009 | Mina et al. |
| 7,788,611 B2 | 8/2010 | Biondi et al. |
| 7,937,678 B2 * | 5/2011 | Lippmann et al. ............ 716/103 |
| 2006/0048081 A1 | 3/2006 | Kiel et al. |
| 2008/0028353 A1 | 1/2008 | Lu et al. |
| 2010/0077366 A1 | 3/2010 | Bjesse |

OTHER PUBLICATIONS

Lu et al., "Enablement of Variation-Aware Timing: Treatment of Parasitic Resistance and Capacitance," ISQED, 2007, pp. 743-748.

Lee et al., "Modelling of thin film SOI devices for circuit simulation including per-instance dynamic self-heating effects," IEEE SOI Conf, 1993, pp. 150-151.

J. Cong, "Modeling and Layout Optimization of VLSI Devices and Interconnects In Deep Submicron Design," UCLA, ASPDAC 1997.

* cited by examiner

SYSTEM, METHOD AND PROGRAM STORAGE DEVICE FOR DEVELOPING CONDENSED NETLISTS REPRESENTATIVE OF GROUPS OF ACTIVE DEVICES IN AN INTEGRATED CIRCUIT AND FOR MODELING THE PERFORMANCE OF THE INTEGRATED CIRCUIT BASED ON THE CONDENSED NETLISTS

BACKGROUND

1. Field of the Invention

The present invention relates to modeling the performance of an integrated circuit and, more particularly, to embodiments of a system, method and program storage device for developing condensed netlists representative of groups of active devices in an integrated circuit and for modeling the performance of the integrated circuit based on the condensed netlists.

2. Description of the Related Art

Traditionally, the performance (i.e., behavioral characteristics, current-voltage (I-V) characteristics, etc.) of an integrated circuit is modeled by first extracting a full netlist, including all active devices, passive devices (e.g., resistors) and interconnects, from the design layout of the integrated circuit. Simulations of the full netlist are then performed over the full range of operating temperatures, over the full range of operating power supply voltages and, optionally, taking into consideration other factors that may impact performance (e.g., self-heating and stress). Additionally, repeated simulations may be required for model calibration and/or to accommodate design modifications or options. Based on the results of the simulations, a performance model for the integrated circuit is generated. Unfortunately, as the complexity of an integrated circuit increases (i.e., as the number of active devices incorporated into the integrated circuit increases), so does the amount of time required to complete the simulations and generate the performance model. Therefore, it would be advantageous to provide a faster method of accurately modeling the performance of an integrated circuit.

SUMMARY

In view of the foregoing, disclosed herein are embodiments of a system, method and program storage device for developing condensed netlists for sub-circuits within an integrated circuit and for modeling the performance of the integrated circuit based on the condensed netlists rather than full netlists. Specifically, the embodiments segment the layout of an integrated circuit into a plurality of sub-circuits, each sub-circuit comprising a group of one or more of a given type of active devices, with each device in the group connected to the same electrical sub-circuit terminals through a similar resistive network (i.e., each device is subjected to approximately the same overall combined parasitic resistances). Full netlists corresponding to these sub-circuits are extracted from the layout and then condensed. Each condensed netlist represents a specific sub-circuit and accounts for performance variations (e.g., as a function of variations in operating power supply voltages, operating temperatures and, optionally, self-heating and/or stress) exhibited by the active devices and resistive network associated with that specific sub-circuit. The condensed netlists for all of the sub-circuits are then simulated over the full range of operating temperatures for the integrated circuit and over a full range of operating power supply voltages for the integrated circuit in order to generate a performance model for the integrated circuit.

More particularly, disclosed herein are embodiments of an integrated circuit performance modeling system. The system can comprise a computer system comprising at least a data storage device, an integrated circuit layout analyzer, a netlist extractor, a netlist condenser and a simulator. In such a system, the data storage device can store a layout of an integrated circuit. The integrated circuit layout analyzer can access the layout and can segment the layout into a plurality of sub-circuits, where each sub-circuit comprises a group of one or more of a given type of active devices, with each device in the group connected to the same electrical sub-circuit terminals through a similar resistive network (i.e., each device in the group is subjected to approximately the same parasitic resistances). The netlist extractor can be in communication with the analyzer and can extract, from the layout, full netlists corresponding to the sub-circuits. The netlist condensor can be in communication with both the netlist extractor and the simulator. The condenser can receive the full netlists from the netlist extractor and, working in conjunction with the simulator, can condense each full netlist corresponding to a specific sub-circuit into a condensed netlist for that specific sub-circuit.

Specifically, the netlist condensor can condense each full netlist into a netlist comprising a single active device and a plurality of parameterizable resistors, where the single active device is the same given type as those active devices in the specific sub-circuit and where each parameterizable resistor is electrically connected to a corresponding terminal of the single active device. The netlist condensor can perform this process such that each condensed netlist represents a specific sub-circuit and accounts for performance variations exhibited by the active devices and resistive network associated with that specific sub-circuit, as a function of variations in operating power supply voltages, operating temperatures and, optionally, self-heating and/or stress. To accomplish this, the simulator can perform a series of simulations of the full netlist over a specified number of temperatures and over a specified number of power supply voltages. The specified number of temperatures can be lesser than, greater than, or the same as the full range of operating temperatures and, similarly, the specified number of power supply voltages can be lesser than, greater than or the same as the full range of operating power supply voltages. As the simulations are being performed, the results can be used by the condenser to set and adjust various parameters of the condensed netlist (e.g., resistance parameters of the parameterizable resistors, a temperature coefficient and, optionally, a self-heating coefficient and one or more stress modifiers) in order match results achieved during the simulations of the full netlist. Finally, the simulator can simulate all of the condensed netlists over the full range of operating temperatures for the integrated circuit and over the full range of operating power supply voltages for the integrated circuit in order to generate a provisional performance model for the integrated circuit. By only simulating the condensed netlists for each sub-circuit over the full range of operating temperatures and operating power supply voltages, rather than the full netlists, the time required to generate the provisional performance model is significantly reduced.

Also disclosed herein are embodiments of a corresponding computer-implemented integrated circuit performance modeling method. The process steps of this method can be performed by various components of a computer system (e.g., as described above) and can comprise first accessing a layout of an integrated circuit stored in a data storage device. The layout can then be segmented into a plurality of sub-circuits, where each sub-circuit comprises a group of one or more of a given type of active devices, with each device in the group connected to the same electrical sub-circuit terminals through a similar resistive network (i.e., each device is subjected to approximately the same parasitic resistances). Next, full netlists corresponding to the sub-circuits can be extracted from the layout. Once the full netlists are extracted, they can be condensed.

Specifically, each full netlist can be condensed into a condensed netlist comprising a single active device and a plurality of parameterizable resistors, where the single active device is the same given type as those active devices in the specific sub-circuit and where each parameterizable resistor is electrically connected to a corresponding terminal of the single active device. This process can be performed such that each condensed netlist represents the specific sub-circuit and accounts for performance variations exhibited by the active devices and resistive network associated with that specific sub-circuit, as a function of variations in operating power supply voltages, operating temperatures and, optionally, self-heating and/or stress. To accomplish this, a series of simulations of the full netlist can be performed over a specified number of temperatures and over a specified number of power supply voltages. The specified number of temperatures can be lesser than, greater than or the same as the full range of temperatures and, similarly, the specified number of power supply voltages can be lesser than, greater than or the same as the full range of operating power supply voltages. As the simulations are being performed, the results can be used to set and adjust various parameters of the condensed netlist (e.g., resistance parameters of the parameterizable resistors, a temperature coefficient and, optionally, a self-heating coefficient and one or more stress modifiers) in order to match results achieved during the simulations of the full netlist. Finally, all condensed netlists can be simulated over the full range of operating temperatures for the integrated circuit and over the full range of operating power supply voltages for the integrated circuit in order to generate a performance model for the integrated circuit. By only simulating the condensed netlists for each sub-circuit over the full range of operating temperatures and operating power supply voltages, rather than the full netlists, the time required to generate the performance model is significantly reduced.

Also disclosed herein are embodiments of a program storage device readable by a computer and tangibly embodying a program of instructions executable by the computer to perform the above-described integrated circuit modeling method.

BRIEF DESCRIPTION OF THE SEVERAL VIEWS OF THE DRAWINGS

The embodiments disclosed herein will be better understood with reference to the drawings, which are not necessarily drawn to scale and in which.

DETAILED DESCRIPTION

Figure 1:
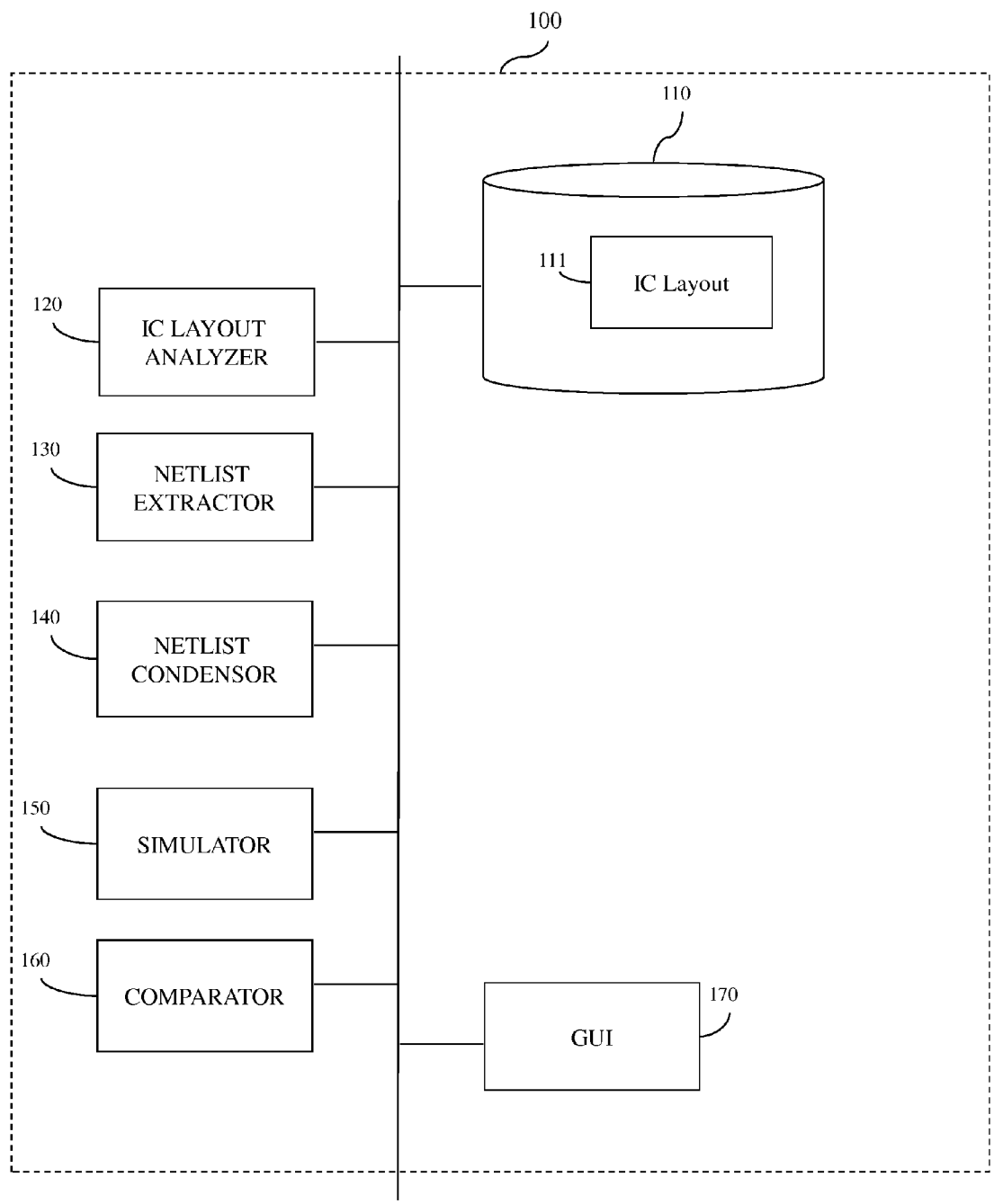
FIG. 1 is a block diagram illustrating an embodiment of an integrated circuit performance modeling system.

The embodiments of the invention and the various features and advantageous details thereof are explained more fully with reference to the non-limiting embodiments that are illustrated in the accompanying drawings and detailed in the following description.

As mentioned above, traditionally, the performance (i.e., behavioral characteristics, current-voltage (I-V) characteristics, etc.) of an integrated circuit is modeled by first extracting a full netlist, including all active devices, passive devices (e.g., resistors) and interconnects, from the design layout of the integrated circuit. Simulations of the full netlist are then performed over the full range of operating temperatures, over the full range of operating power supply voltages and, optionally, taking into consideration other factors that may impact performance (e.g., self-heating and stress). Additionally, repeated simulations may be required for model calibration and/or to accommodate design modifications or options. Based on the results of the simulations, a performance model for the integrated circuit is generated. Unfortunately, as the complexity of an integrated circuit increases (i.e., as the number of active devices incorporated into the integrated circuit increases), so does the amount of time required to complete the simulations and generate the performance model. Various solutions have been proposed for reducing the overall time required to generate a performance model (e.g., a conversion table method and a single device extraction method). However, the performance models generated by these methods are often prone to significant errors (e.g., over 2%), due to a failure to accurately consider factors such as parasitic resistances, self-heating and/or stress. Therefore, it would be advantageous to provide a faster method of accurately modeling the performance of an integrated circuit.

In view of the foregoing, disclosed herein are embodiments of a system, method and program storage device for developing condensed netlists for sub-circuits within an integrated circuit and for modeling the performance of the integrated circuit based on the condensed netlists rather than full netlists. Specifically, the embodiments segment the layout of an integrated circuit into a plurality of sub-circuits, each sub-circuit comprising a group of one or more of a given type of active devices, with each device in the group connected to (i.e., sharing) the same electrical sub-circuit terminals through a similar resistive network (i.e., each device is subjected to approximately the same parasitic resistances). Full netlists corresponding to these sub-circuits are extracted from the layout and then condensed. Each condensed netlist represents a specific sub-circuit and accounts for performance variations (e.g., as a function of variations in operating power supply voltages, operating temperatures and, optionally, self-heating and/or stress) exhibited by the active devices and resistive network associated with that specific sub-circuit. The condensed netlists for all of the sub-circuits are then simulated over the full range of operating temperatures for the integrated circuit and over a full range of operating power supply voltages for the integrated circuit in order to generate a performance model for the integrated circuit.

More particularly, referring to FIG. 1, disclosed herein are embodiments of an integrated circuit performance modeling system 100. The system 100 can comprise a computer system comprising at least a data storage device 110, an integrated circuit layout analyzer 120, a netlist extractor 130, a netlist condenser 140, a simulator 150, user interface 170, and, optionally, a comparator 160.

In such a system 100, the data storage device 110 can store (i.e., can be adapted to store, configured to store, etc.) a design layout 111 of an integrated circuit. Specifically, this layout 111 can comprise a geometric representation of a design of an integrated circuit, which is made up of a relatively large number (e.g., thousands) of active devices of various types, passive devices and interconnects. The active devices can comprise, for example, field effect transistors, bipolar transistors, heterojunction bipolar transistors, diodes, etc. and the passive devices can comprise resistors, capacitors, inductors, transformers, etc.

Figure 2:
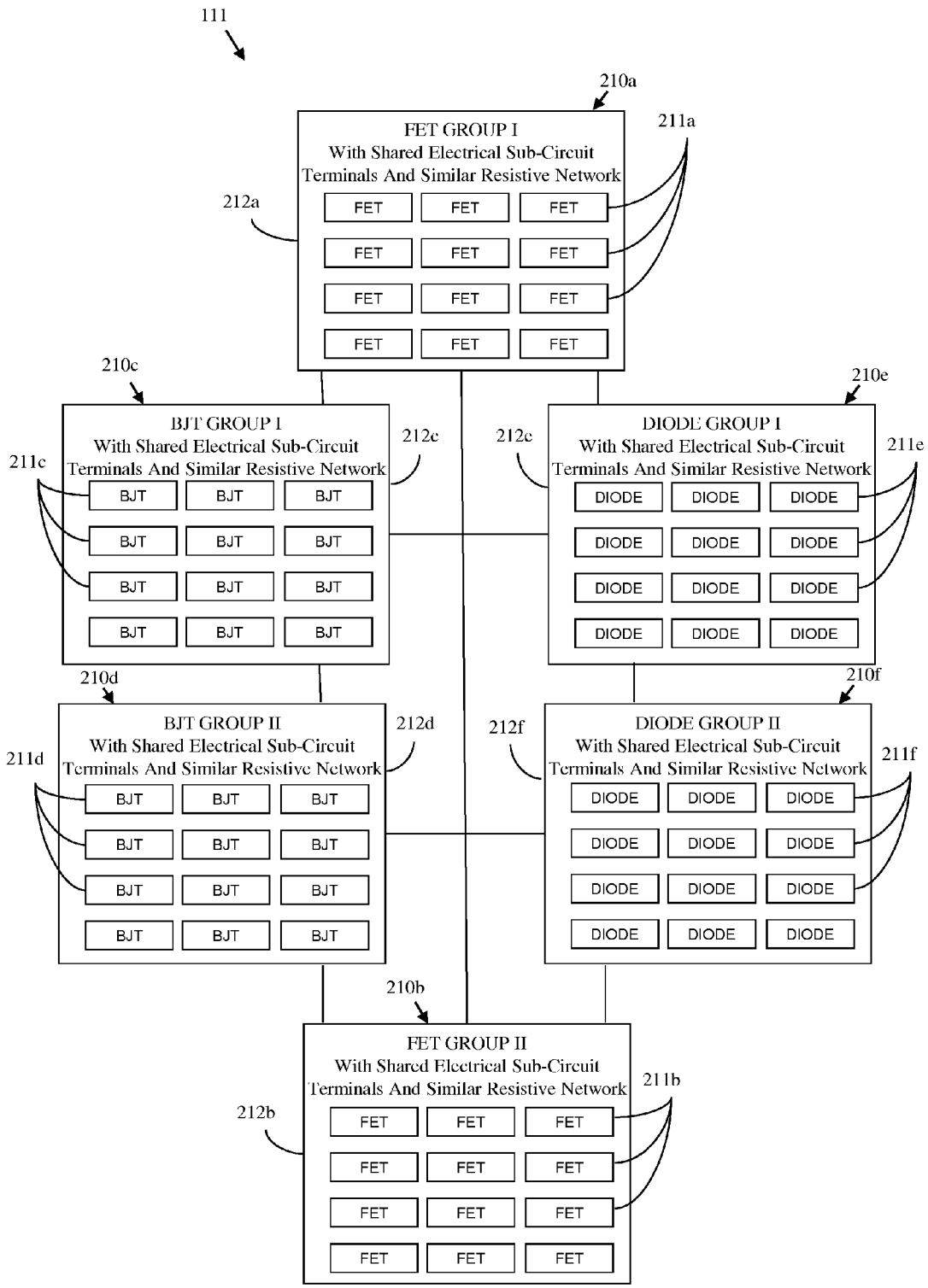
FIG. 2 is a block diagram illustrating segmentation of an integrated circuit layout into sub-circuits.

The integrated circuit layout analyzer 120 can access the layout 111 from the data storage device 110 and can segment the layout 111 into a plurality of sub-circuits, where each sub-circuit comprises a group of one or more of a given type of active devices (e.g., over a thousand essentially identical active devices), with each device in the group connected to (i.e., sharing) the same electrical sub-circuit terminals through a similar resistive network (i.e., each device is subjected to approximately the same parasitic resistances). For example, as shown in FIG. 2, a layout 111 of an integrated circuit can be segmented into sub-circuits 210a-f. In the sub-circuit 210a the active devices can be parallel nearly identical (i.e., essentially identical) field effect transistors 211a connected to (i.e., sharing) the same electrical sub-circuit terminals through resistive network 212a. Field effect transistors that are nearly identical (i.e., essentially identical) can be field effect transistors having the same design (i.e., designed to have the same channel width, the same channel length, same threshold voltage, same conductivity type, same materials, etc.). In the sub-circuit 210b the active devices can be parallel nearly identical field effect transistors 211b, which are different from the field effect transistors 211a (i.e., which are design differently so as to have a different channel width, different threshold voltage, different conductivity type, etc. than the field effect transistors 211a) and connected to (i.e., sharing) the same electrical sub-circuit terminals through the resistive network 211b. Other sub-circuits can comprise other types of devices. For example, each sub-circuit 210c, 210 d can comprise parallel nearly identical bipolar transistors 211c, 211d (i.e., bipolar transistors having the same design) connected to (i.e., sharing) the same electrical sub-circuit terminals through a resistive network 212c, 212d, respectively. Similarly, each sub-circuit 210e, 210f can comprise parallel nearly identical diodes 211e, 211f (i.e., diodes having the same design) connected to (i.e., sharing) the same electrical sub-circuit terminals through a resistive network 212e, 211f, respectively. It should be noted that an active device that does not share sub-circuit terminals and/or does not share a similar resistive network as any other active device of the same type (i.e., is not subjected to approximately the same parasitic resistances as any other active device sharing the same terminals) would be segmented into its own group for purposes of this invention.

The netlist extractor 130 (also referred to in the art as a netlist generator) can be in communication with the analyzer 120 and can extract (i.e., can be adapted to extract, configured to extract, etc.), from the layout 111, full netlists corresponding to the sub-circuits. Specifically, the netlist extractor 130 can translate each specific sub-circuit of the layout 111 into a full netlist that comprises text files, which describe the various components of the specific sub-circuit and how those components are connected and which are formatted to be compatible with a particular simulator 150, as described in detail below. Netlist extractors are well-known in the art and, thus, the details of such netlist extractors are omitted from this specification in order to allow the reader to focus on the salient aspects of the invention.

The netlist condensor 140 can be in communication with both the netlist extractor 130 and the simulator 150. The condenser 140 can receive the full netlists from the netlist extractor 130 and, working in conjunction with the simulator 150, can condense each full netlist corresponding to a specific sub-circuit into a condensed netlist (also referred to as a fast netlist, an abridged netlist, a short netlist, a compressed netlist, etc.) for that specific sub-circuit. Specifically, the netlist condensor 140 can condense (i.e., shorten, abridge, compress, etc.) each full netlist into a netlist comprising a single active device and a plurality of parameterizable resistors (i.e., resistors with adjustable resistance parameters), where the single active device is the same given type as those active devices in the specific sub-circuit and where each parameterizable resistor is electrically connected to a corresponding terminal of the single active device.

Figure 3:
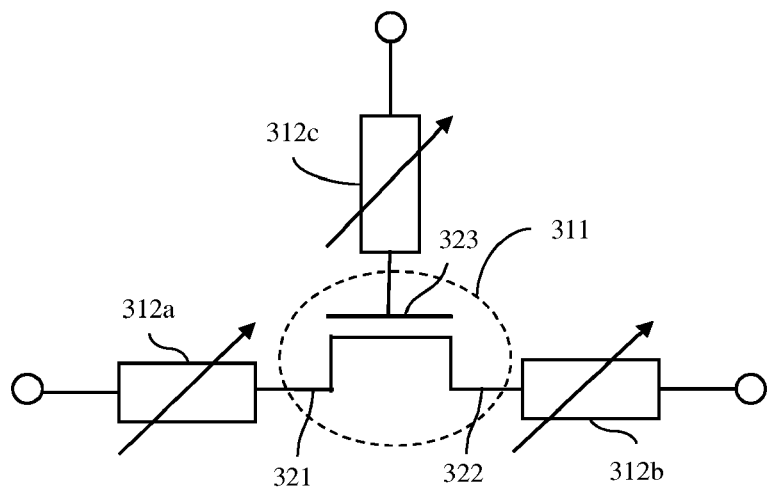
FIG. 3 is a schematic diagram illustrating an exemplary configuration for a condensed netlist.
Figure 4:
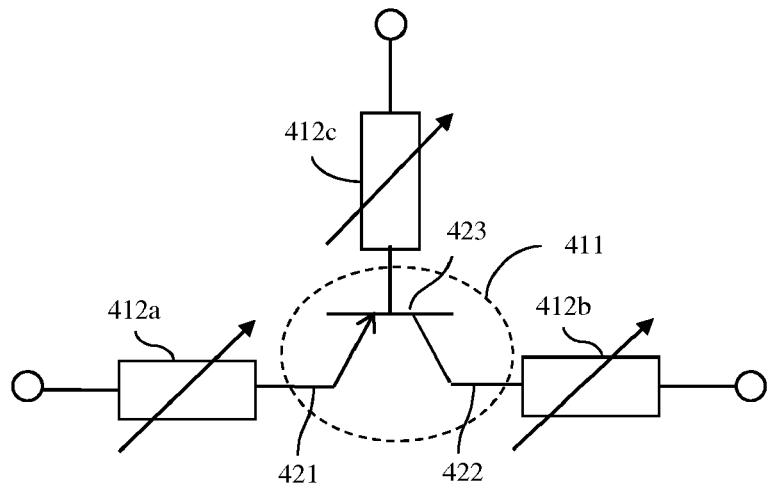
FIG. 4 is a schematic diagram illustrating another exemplary configuration for a condensed netlist.

For example, referring to FIG. 3 in conjunction with FIG. 2, the full netlist corresponding to the sub-circuit 210a, which comprises a plurality of parallel essentially identical field effect transistors 211a connected to (i.e., sharing) the same electrical sub-circuit terminals through a similar resistive network 212a, can be condensed into a netlist comprising a single field effect transistor 311 with parameterizable resistors 312a-c electrically connected in series to the three terminals of the field effect transistor (i.e., to the source 321, drain 322 and gate 323, respectively). Referring to FIG. 4 in conjunction with FIG. 2, the full netlist corresponding to the sub-circuit 210c, which comprises a plurality of parallel essentially identical bipolar transistors 211c connected to (i.e., sharing) the same electrical sub-circuit terminals through a similar resistive network 212c, can be condensed into a netlist comprising a single bipolar transistor 411 with parameterizable resistors 412a-c electrically connected in series to the three terminals of the bipolar transistor (i.e., to the emitter 421, collector 422 and base 423, respectively). Finally, referring to FIG. 5 in conjunction with FIG. 2, the full netlist corresponding to the sub-circuit 210e, which comprises a plurality of parallel essentially identical diodes 211e connected to (i.e., sharing) the same electrical sub-circuit terminals through a similar resistive network 212e, can be condensed into a netlist comprising a single diode 511 with parameterizable resistors 512a-b electrically connected in series to the two terminals 521-522 of the diode.

The netlist condensor 140 can perform this process such that each condensed netlist represents a specific sub-circuit (e.g., 210a-f of FIG. 2) and is designed to account for performance variations exhibited by the active devices and the resistive network associated with that specific sub-circuit, as a function of variations in operating power supply voltages, operating temperatures and, optionally, self-heating and/or stress. To accomplish this, the simulator 150 can perform a series of simulations of the full netlist over a specified number of temperatures and over a specified number of power supply voltages. The specified number of temperatures can be less or greater than the full range of operating temperatures and, similarly, the specified number of power supply voltages can be less or grater than the full range of operating power supply voltages. As the simulations are being performed, the results can be used by the condenser 140 to set and adjust various parameters of the condensed netlist (e.g., resistance parameters of the parameterizable resistors, a temperature coefficient and, optionally, a self-heating coefficient and one or more stress modifiers) in order match results achieved during the simulations of the full netlist.

Specifically, the simulator 150 can comprise a simulator, such as a Simulation Program With Integrated Circuit Emphasis (SPICE) simulator, capable of performing (i.e., adapted to perform, configured to perform, programmed to perform, etc.) a detailed analysis of an integrated circuit that contains active and passive components in order to determine performance characteristics (i.e., behavioral characteristics, current-voltage (I-V) characteristics, etc.) of the integrated circuit as a function of variations in operating power supply voltages, operating temperatures and, optionally, self-heating and/or stress. During netlist condensing, the simulator 150 can perform a first set of simulations of the full netlist over a single predetermined temperature (e.g., a nominal temperature, such as room temperature or 25° C.) and a plurality of predetermined power supply voltages (Vdds) (e.g., less than 20 different Vdds, e.g., 5-8 different Vdds). The predetermined power supply voltages can be within and, preferably, can be distributed approximately evenly across the full range of operating power supply voltages for the integrated circuit. For example, the if the full range is 0.6V to 1.3V and then the Vdd values used during the first set of simulations can be 0.6V, 0.7V, 0.8V, 0.9V, 1.0V, 1.1V, 1.2V, and 1.3V. Next, the condenser 140 can set resistance parameters for the parameterizable resistors in the condensed netlist to match a first set of results from the first set of simulations.

For example, as mentioned above, a condensed netlist for a specific sub-circuit (e.g., the sub-circuit 210a of FIG. 2) can comprise a single field effect transistor 311 and a plurality of variable transistors 312a-c connected in series to the source 321, drain 322 and gate 323 of that field effect transistor 311, respectively (see FIG. 3). In this case, the first set of results from the first set of simulations performed by the simulator 150 can comprise direct current (DC) calculations of average values over all the field effect transistors in the sub-circuit 210a for, for example, constant linear overdrive current (Iodlin), linear drain current (Idlin), saturated drain current (Idsat) and/or gate current (Igate) and the netlist condensor 140 can set the resistance parameters for the parameterizable resistors 312a-c to achieve the same results. That is, the total source-drain parasistic resistance can be set to achieve the constant linear overdrive current (Iodlin) and/or the linear drain current (Idlin) derived from the first set of simulations. Additionally or alternatively, the source parasitic resistance and drain parasitic resistance can be set to achieve the saturated drain current (Idsat) derived from the first set of simulations. Finally, additionally or alternatively, the parasitic gate resistance can be set to achieve the gate current (Igate) derived from the first set of simulations.

Also, as mentioned above, a condensed netlist for a specific sub-circuit (e.g., the sub-circuit 210c of FIG. 2) can comprise a single bipolar junction transistor 411 and a plurality of variable transistors 412a-c connected in series to the emitter 421, collector 422 and gate 423 of that field effect transistor 411, respectively (see FIG. 4). In this case, the first set of results from the first set of simulations performed by the simulator 150 can comprise direct current (DC) calculations of average values over all of the bipolar junction transistors in the sub-circuit 210c for collector current under high collector bias and at a high injection condition in the normal active region, for collector current under low and medium collector bias in the normal active region, for collector current in the saturation region and for base current in the normal active region and the netlist condensor 140 can set the resistance parameters for the parameterizable resistors 412a-c to achieve the same results. That is, the total collector-emitter parasitic resistance can be set to achieve the collector current derived from the first set of simulations under high collector bias and at a high injection condition in the normal active region. Additionally, the collector parasitic resistance can be set to achieve the collector current derived from the first set of simulations under low and medium collector bias in the normal active region. Finally, the emitter parasitic resistance and base parasitic resistance can be set to achieve the base current derived from the first set of simulations in the normal active region and the collector current derived from the first set of simulations in the saturation region.

Figure 5:
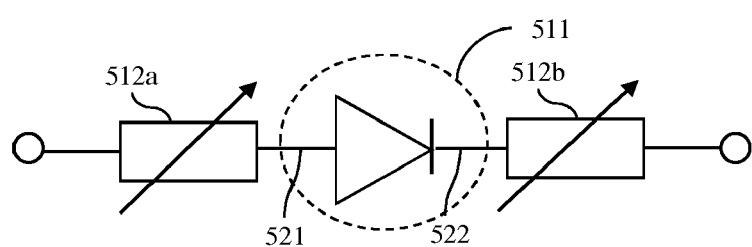
FIG. 5 is a schematic diagram illustrating yet another exemplary configuration for a condensed netlist.

Also, as mentioned above, a condensed netlist for a specific sub-circuit (e.g., the sub-circuit 210e of FIG. 2) can comprise a single diode 511 and a plurality of variable transistors 512a-b connected in series to the terminals 521-522 of this diode 511, respectively (see FIG. 5). In this case, the first set of results from the first set of simulations performed by the simulator 150 can comprise direct current (DC) calculations of average values over all the diodes in the sub-circuit 210e for diode current under high forward bias and in a high injection condition and diode current under low and medium forward bias and reverse bias and the netlist condensor 140 can set the resistance parameters for the parameterizable resistors 512a-b in the to achieve the same results. That is, the total anode-cathode parasitic resistance can be set to achieve the diode current derived from the first set of simulations under high forward bias and high injection condition. Additionally, the anode parasitic resistance and cathode parasitic resistance can be set to achieve the diode current derived from the first set of simulations under low and medium forward bias and reverse bias.

Once these resistance parameters are set, the simulator 150 can perform a second set of simulations of the full netlist. This second set of simulations can be performed over a plurality of predetermined temperatures (e.g., less than 20 different temperatures and, preferably, 5-6 different temperatures) and over the same predetermined power supply voltages used in the first set of simulations. The predetermined temperatures can be within and, preferably, can be distributed approximately evenly across the full range of operating temperatures for the integrated circuit. For example, the range of temperatures can be −40° C. to 125° C. and the temperature values used during this second set of simulations can be −40° C., 10° C., 25° C., 55° C., 85° C., and 125° C. Next, the netlist condensor 140 can set the temperature coefficient for the condensed netlist to match a second set of results from the second set of simulations.

Optionally, the simulator 150 can further perform a third set of simulations of the full netlist. This third set of simulations can be performed over the same plurality of predetermined temperatures and the same plurality of predetermined power supply voltages. However, this third set of simulations can also consider self-heating of the active devices in the sub-circuit and the resistors connected to those active devices in the sub-circuit (i.e., the self-heating function, which was turned off in the first and second set of simulations, can now be turned on). Then, the netlist condensor 140 can set a self-heating coefficient for the condensed netlist to match a third set of results from the third set of simulations (i.e., so the active device and parameterizable resistors of the condensed netlist exhibit the same self-heating properties as the active devices and resistive network of the full netlist).

Optionally, the simulator 150 can further perform a fourth set of simulations of the full netlist over the same plurality of predetermined temperatures and the same plurality of predetermined power supply voltages. However, this fourth set of simulations can also consider self-heating of the active devices in the sub-circuit and the resistors connected to those active devices in the sub-circuit as well as stress on the active devices in the sub-circuit and/or on the resistors connected to those active devices in the sub-circuit (i.e., the self-heating and stress functions, which were turned off in the first and second set of simulations, can now both be turned on). Then, the netlist condenser 140 can set the stress parameters for the parameterizable resistors and the single active device, the charge carrier mobility for the single active device and/or the threshold voltage of the single active device to match a fourth set of results from the fourth set of simulations (i.e., so the active device and parameterizable resistors of the condensed netlist exhibit the same self-heating properties and stress effects as the active devices and resistive network of the full netlist).

It should be noted that the nonlinear I-V characteristics of the active devices can amplify any fitting error of resistances, temperature coefficient, self-heating coefficient, and stress modifiers in the original models and, thereby ensure accurate matching of the condensed netlists to the full netlists.

Once the condensed netlists are developed for all of the sub-circuits, the simulator 150 can simulate (i.e., can be adapted to simulate, configured to simulate, programmed to simulate, etc.) all of the condensed netlists over the full range of operating temperatures for the integrated circuit and over the full range of operating power supply voltages for the integrated circuit in order to generate a provisional performance model for the integrated circuit. As mentioned above, the full range of operating temperatures for the integrated circuit can be, for example, −40° C. to 125° C. and the full range of operating power supply voltages for the integrated circuit can be, for example, 0.6V to 1.3V. Simulating the condensed netlists over these ranges can be performed in stepwise fashion, for example, at every 0.5, 1, or 5 degrees and at every 0.1, 0.5, 1 or 5 volts so that over a hundred temperatures and over a hundred power supply voltages are considered.

It should be noted that, at some time in the future (e.g., when time and equipment are available), the simulator 150 can further perform (i.e., can be adapted to perform, configured to perform, programmed to perform, etc.) a final set of simulations of each full netlist over the full range of operating temperatures for the integrated circuit and the full range of operating power supply voltages for the integrated circuit in order to generate a final performance model (i.e., a complete performance model) for the integrated circuit. The comparator 160 can compare (i.e., can be adapted to compare, configured to compare, programmed to compare, etc.) this final performance model generated based on the full netlists to the provisional performance model generated based on the condensed netlists in order to verify the accuracy of the provisional performance model. By initially simulating the condensed netlists for each sub-circuit, as described, over the full range of operating temperatures and operating power supply voltages, rather than the full netlists, the time required to generate the provisional performance model is significantly reduced over the time required to generate the final performance model (e.g., to minutes or less as compared to hours or days). In the meantime, the provisional performance model can, optionally, be output via the user interface 170 (e.g., a conventional graphical user interface (GUI)) to a designer for use in adjusting design criteria (e.g., if the provisional performance model indicates that the performance characteristics of the integrated circuit are not acceptable).

Figure 6:
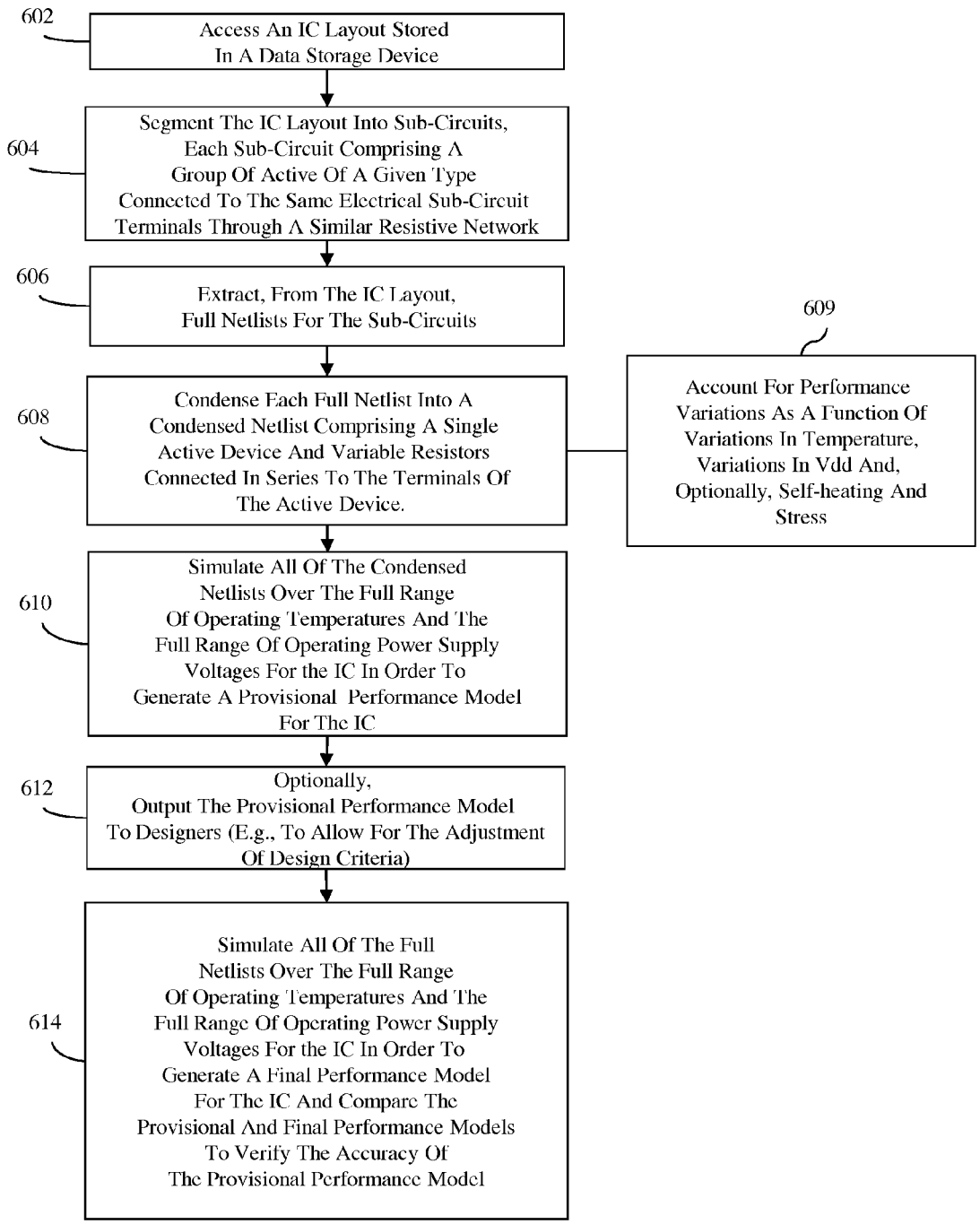
FIG. 6 is a flow diagram illustrating an embodiment of an integrated circuit performance modeling method.

FIG. 6 is a flow diagram illustrating embodiments of a corresponding computer-implemented integrated circuit performance modeling method. Referring to FIG. 6, the process steps of this method can be performed by various components of a computer system (e.g., the computer system 100 illustrated in FIG. 1 and described in detail above). The method can comprise first accessing a design layout 111 of an integrated circuit stored in a data storage device 110 (602). Specifically, the layout 111 can comprise a geometric representation of a design of an integrated circuit, which is made up of a relatively large number (e.g., thousands) of active devices of various types, passive devices and interconnects. The active devices can comprise, for example, field effect transistors, bipolar transistors, heterojunction bipolar transistors, diodes, etc. and the passive devices can comprise resistors, capacitors, inductors, transformers, etc.

The layout 111 can then be segmented (e.g., by an IC layout analyzer 120 of the system 100) into a plurality of sub-circuits, where each sub-circuit comprises a group of one or more of a given type of active devices (e.g., over a thousand essentially identical active devices), with each device in the group connected to (i.e., sharing) the same electrical sub-circuit terminals through a similar resistive network (i.e., each device is subjected to approximately the same parasitic resistances) (604). For example, as shown in FIG. 2, the layout 111 of an integrated circuit can be segmented into sub-circuits 210a-f. In the sub-circuit 210a the active devices can be parallel nearly identical (i.e., essentially identical) field effect transistors 211a connected to (i.e., sharing) the same electrical sub-circuit terminals through the resistive network 212a. Field effect transistors that are nearly identical (i.e., essentially identical) can be field effect transistors having the same design (i.e., designed to have the same channel width, the same channel length, same threshold voltage, same conductivity type, same materials, etc.). In the sub-circuit 210b the active devices can be parallel nearly identical field effect transistors 211b, which are different from the field effect transistors 211a (i.e., which are designed differently so as to have a different channel width, different threshold voltage, different conductivity type, etc. than the field effect transistors 211a) and connected to (i.e., sharing) the same electrical sub-circuit terminals in the resistive network 211b. Other sub-circuits can comprise other types of devices. For example, each sub-circuit 210c, 210 d can comprise parallel nearly identical bipolar transistors 211c, 211d (i.e., bipolar transistors having the same design) connected to (i.e., sharing) the same electrical sub-circuit terminals through a resistive network 212c, 212d, respectively. Similarly, each sub-circuit 210e, 210f can comprise parallel nearly identical diodes 211e, 211f (i.e., diodes having the same design) connected to (i.e., sharing) the same electrical sub-circuit terminals through a resistive network 212e, 211f, respectively. It should be noted that an active device that does not share sub-circuit terminals and/or does not share a similar resistive network as any other active device of the same type (i.e., is not subjected to approximately the same parasitic resistances as any other active device sharing the same terminals) would be segmented into its own group for purposes of this invention.

Next, full netlists corresponding to the sub-circuits can be extracted from the layout 111 (e.g., by a netlist extractor 130 of the computer system 100) (606). Specifically, each specific sub-circuit of the layout 111 can translated into a full netlist that comprises text files, which describe the various components of the specific sub-circuit and how those components are connected and which are formatted to be compatible with the simulator 150 of the system 100 used in subsequent processes, as described in detail below.

Once the full netlists are extracted at process 606, they can be condensed (e.g., by network condensor 140 of the system 100 working in conjunction with the simulator 150) (608).

Specifically, each full netlist corresponding to a specific sub-circuit can be condensed into a condensed netlist (also referred to as a fast netlist, an abridged netlist, a short netlist, a compressed netlist, etc.) for that specific sub-circuit. The resulting condensed netlist can comprise a single active device and a plurality of parameterizable resistors (i.e., resistors with adjustable resistance parameters), where the single active device is the same given type as those active devices in the specific sub-circuit and where each parameterizable resistor is electrically connected to a corresponding terminal of the single active device.

For example, referring to FIG. 3 in conjunction with FIG. 2, the full netlist corresponding to the sub-circuit 210a, which comprises a plurality of parallel essentially identical field effect transistors 211a connected to (i.e., sharing) the same electrical sub-circuit terminals through a similar resistive network 212a, can be condensed at process 608 into a netlist comprising a single field effect transistor 311 with parameterizable resistors 312a-c electrically connected in series to the three terminals of the field effect transistor (i.e., to the source 321, drain 322 and gate 323, respectively). Referring to FIG. 4 in conjunction with FIG. 2, the full netlist corresponding to the sub-circuit 210c, which comprises a plurality of parallel essentially identical bipolar transistors 211c connected to (i.e., sharing) the same electrical sub-circuit terminals through a similar resistive network 212c, can be condensed at process 608 into a netlist comprising a single bipolar transistor 411 with parameterizable resistors 412a-c electrically connected in series to the three terminals of the bipolar transistor (i.e., to the emitter 421, collector 422 and base 423, respectively). Finally, referring to FIG. 5 in conjunction with FIG. 2, the full netlist corresponding to the sub-circuit 210e, which comprises a plurality of parallel essentially identical diodes 211e connected to (i.e., sharing) the same electrical sub-circuit terminals through a similar resistive network 212e, can be condensed at process 608 into a netlist comprising a single diode 511 with parameterizable resistors 512a-b electrically connected in series to the two terminals 521-522 of the diode.

This condensing process 608 can be performed so that each condensed netlist represents a specific sub-circuit (e.g., 210a-f of FIG. 2) and is designed to account for performance variations exhibited by the active devices and the resistive network associated with that specific sub-circuit, as a function of variations in operating power supply voltages, operating temperatures and, optionally, self-heating and/or stress (609). To accomplish this, a series of simulations can be performed of the full netlist (e.g., by the simulator 150 of the system 100) over a specified number of temperatures and over a number of power supply voltages in order to determine performance characteristics (i.e., behavioral characteristics, current-voltage (I-V) characteristics, etc.) of the integrated circuit as a function of variations in operating power supply voltages, operating temperatures and, optionally, self-heating and/or stress. The specified number of temperatures can be less or greater than the full range of operating temperatures and, similarly, the specified number of power supply voltages can be less or grater than the full range of operating power supply voltages. As the simulations are being performed, the results can be used (e.g., by the netlist condensor 140 of the system 100) to set and adjust various parameters of the condensed netlist (e.g., resistance parameters of the parameterizable resistors, a temperature coefficient and, optionally, a self-heating coefficient and one or more stress modifiers) in order match results achieved during the simulations of the full netlist.

Figure 7:
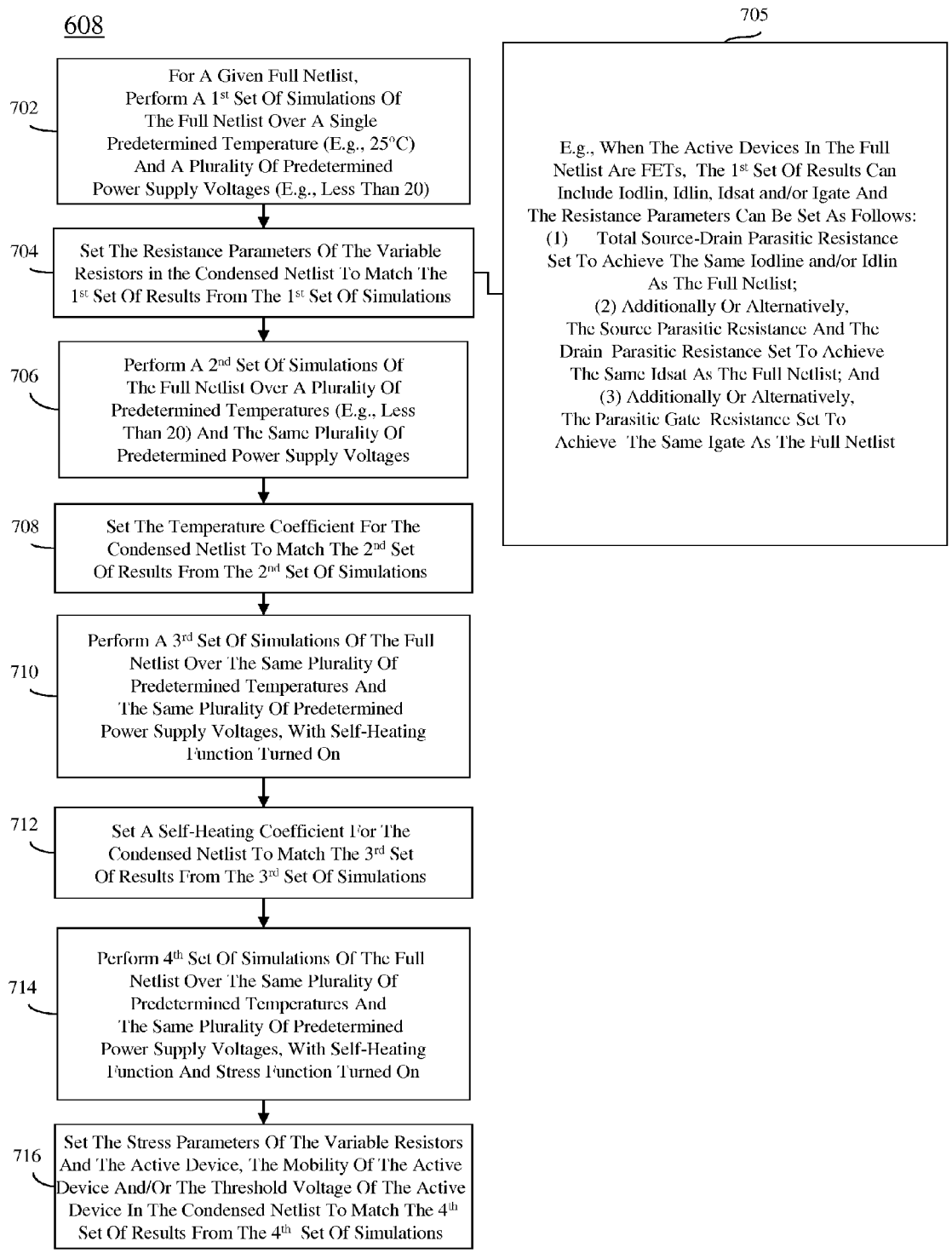
FIG. 7 is a flow diagram further illustrating process 608 of FIG. 6.

FIG. 7 is a flow diagram further illustrating the method steps that can be used to perform process 608 of FIG. 6. Specifically, referring to FIG. 7, this process 608 can comprise performing a first set of simulations of the full netlist over a single predetermined temperature (e.g., a nominal temperature, such as room temperature or 25° C.) and a plurality of predetermined power supply voltages (Vdds) (e.g., less than 20 different Vdds and, preferably, 5-8 different Vdds) (702). The predetermined power supply voltages can be within and, preferably, can be distributed approximately evenly across the full range of operating power supply voltages for the integrated circuit. For example, the if the full range is 0.6V to 1.3V and then the Vdd values used during the first set of simulations can be 0.6V, 0.7V, 0.8V, 0.9V, 1.0V, 1.1V, 1.2V, and 1.3V. Next, resistance parameters for the parameterizable resistors in the condensed netlist can be set to match a first set of results from the first set of simulations (704-705).

For example, as mentioned above, a condensed netlist for a specific sub-circuit (e.g., the sub-circuit 210a of FIG. 2) can comprise a single field effect transistor 311 and a plurality of variable transistors 312a-c connected in series to the source 321, drain 322 and gate 323 of that field effect transistor 311, respectively (see FIG. 3). In this case, the first set of results from the first set of simulations performed by the simulator 150 can comprise direct current (DC) calculations of average values over all the field effect transistors in the sub-circuit 210a for, for example, constant linear overdrive current (Iodlin), linear drain current (Idlin), saturated drain current (Idsat) and/or gate current (Igate) and the netlist condensor 140 can set the resistance parameters for the parameterizable resistors 312a-c to achieve the same results. That is, the total source-drain parasitic resistance can be set to achieve the constant linear overdrive current (Iodlin) and/or the linear drain current (Idlin) derived from the first set of simulations. Additionally or alternatively, the source parasitic resistance and drain parasitic resistance can be set to achieve the saturated drain current (Idsat) derived from the first set of simulations. Finally, additionally or alternatively, the parasitic gate resistance can be set to achieve the gate current (Igate) derived from the first set of simulations.

As discussed in detail above with regard to the system embodiments, the set of results and resistance parameters will vary as a function of the type of active devices within the sub-circuit and, thereby within the condensed netlist.

Once these resistance parameters are set, a second set of simulations of the full netlist can be performed (706). This second set of simulations can be performed over a plurality of predetermined temperatures (e.g., less than 20 different temperatures and, preferably, 5 different temperatures) and over the same predetermined power supply voltages used in the first set of simulations. The predetermined temperatures can be within and, preferably, can be distributed approximately evenly across the full range of operating temperatures for the integrated circuit. For example, the range of temperatures can be −40° C. to 125° C. and the temperature values used during this second set of simulations can be −40° C., 10° C., 25° C., 55° C., 85° C., and 125° C. Next, the temperature coefficient for the condensed netlist can be set to match a second set of results from the second set of simulations (708).

Optionally, a third set of simulations of the full netlist can be performed (710). This third set of simulations can, like the second set, be performed over the same plurality of predetermined temperatures and the same plurality of predetermined power supply voltages. However, this third set of simulations can also consider self-heating of the active devices in the sub-circuit and the resistors connected to the active devices in the sub-circuit (i.e., the self-heating function, which was turned off in the first and second set of simulations, can now be turned on). Then, the self-heating coefficient for the condensed netlist can be set to match a third set of results from the third set of simulations (i.e., so the active device and parameterizable resistors of the condensed netlist exhibit the same self-heating properties as the active devices and resistive network of the full netlist) (712).

Optionally, a fourth set of simulations of the full netlist can also be performed (714). Again, this fourth set of simulations can be performed over the same plurality of predetermined temperatures and the same plurality of predetermined power supply voltages. However, this fourth set of simulations can also consider self-heating of the active devices in the sub-circuit and the resistors connected to the active devices in the sub-circuit as well as stress on the active devices in the sub-circuit and/or on the resistors connected to the active devices on the sub-circuit (i.e., the self-heating and stress functions, which were turned off in the first and second set of simulations, can now both be turned on). Then, the stress parameters for the parameterizable resistors and the single active device, the charge carrier mobility for the single active device and/or the threshold voltage of the single active device can be set to match a fourth set of results from the fourth set of simulations (i.e., so the active device and parameterizable resistors of the condensed netlist exhibit the same self-heating properties and stress effects as the active devices and resistive network of the full netlist) (716).

It should be noted that the nonlinear I-V characteristics of the active devices amplify any fitting error of resistances, temperature coefficient, self-heating coefficient, and stress modifiers and, thereby ensure accurate matching of the condensed netlists to the full netlists.

Referring again to FIG. 6, once the condensed netlists are developed for all of the sub-circuits at process 608, all of the condensed netlists can be simulated (e.g., by the simulator 150) over the full range of operating temperatures for the integrated circuit and over the full range of operating power supply voltages for the integrated circuit in order to generate a provisional performance model for the integrated circuit (610-612). As mentioned above, the full range of operating temperatures for the integrated circuit can be, for example, −40° C. to 125° C., and the full range of operating power supply voltages for the integrated circuit can be, for example, 0.6V to 1.3V. Simulating the condensed netlists over these ranges can be performed in stepwise fashion, for example, at every 0.5, 1, or 5 degrees and at every 0.1, 0.5, 1 or 5 volts so that over a hundred temperatures and over a hundred power supply voltages are considered.

It should be noted that, at some time in the future (e.g., when time and equipment are available), a final set of simulations of each full netlist can be performed (e.g., by the simulator 150) over the full range of operating temperatures for the integrated circuit and the full range of operating power supply voltages for the integrated circuit in order to generate a final performance model (i.e., a complete performance model) for the integrated circuit (614). Then, this final performance model generated based on the full netlists at process 614 can be compared to the provisional performance model generated based on the condensed netlists at process 612 in order to verify the accuracy of the provisional performance model. By initially simulating the condensed netlists for each sub-circuit, as described, over the full range of operating temperatures and operating power supply voltages at process 610, rather than the full netlists, the time required to generate the provisional performance model is significantly reduced over the time required to generate the final performance model (e.g., to minutes or less as compared to hours or days). In the meantime, the provisional performance model can, optionally, be output (e.g., via a user interface 170 of the system 100) to a designer for use in adjusting design criteria (e.g., if the provisional performance model indicates that the performance characteristics of the integrated circuit are not acceptable) (612).

Also disclosed herein are embodiments of a program storage device readable by a computer and tangibly embodying a program of instructions executable by the computer to perform the above-described integrated circuit modeling method. In other words, aspects of the present invention may be embodied as a system (e.g., as described in detail above and illustrated in FIG. 1), a method (e.g., as described in detail above and illustrated in FIGS. 4-5) or as a program storage device or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device. Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described above with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

Figure 8:
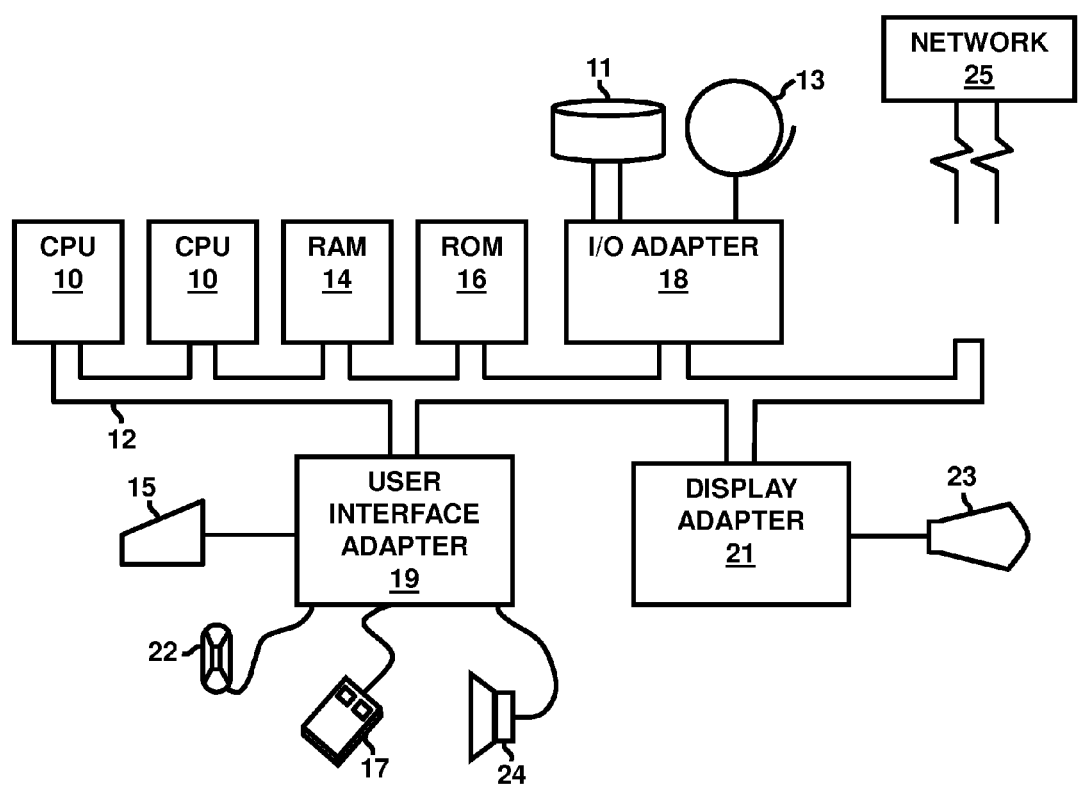
FIG. 8 is a schematic representation of a computer system suitable for implementing the embodiments of the invention as described herein.

A representative hardware environment for practicing the embodiments of the invention is depicted in FIG. 8. This schematic drawing illustrates a hardware configuration of an information handling/computer system in accordance with the embodiments of the invention. The system comprises at least one processor or central processing unit (CPU) 10. The CPUs 10 are interconnected via system bus 12 to various devices such as a random access memory (RAM) 14, read-only memory (ROM) 16, and an input/output (I/O) adapter 18. The I/O adapter 18 can connect to peripheral devices, such as disk units 11 and tape drives 13, or other program storage devices that are readable by the system. The system can read the inventive instructions on the program storage devices and follow these instructions to execute the methodology of the embodiments of the invention. The system further includes a user interface adapter 19 that connects a keyboard 15, mouse 17, speaker 24, microphone 22, and/or other user interface devices such as a touch screen device (not shown) to the bus 12 to gather user input. Additionally, a communication adapter 20 connects the bus 12 to a data processing network 25, and a display adapter 21 connects the bus 12 to a display device 23 which may be embodied as an output device such as a monitor, printer, or transmitter, for example.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

It should be understood that the terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. Additionally, it should be understood that the corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

It should be understood that while resistive networks, such as those described above, may include reactive elements (e.g., capacitors, inductors and/or transformers); however, for purposes of the embodiments of the present invention, such reactive elements are not considered. That is, the embodiments are designed to tune a direct current (DC) network without considering the reactive elements that contribute to that network.

Therefore, disclosed above are embodiments of a system, method and program storage device for developing condensed netlists for sub-circuits within an integrated circuit and for modeling the performance of the integrated circuit based on the condensed netlists rather than full netlists. Specifically, the embodiments segment the layout of an integrated circuit into a plurality of sub-circuits, each sub-circuit comprising a group of one or more of a given type of active devices, with each device in the group connected to (i.e., sharing) the same electrical sub-circuit terminals through a similar resistive network (i.e., such that they are subjected to approximately the same overall combined parasitic resistances). Full netlists corresponding to these sub-circuits are extracted from the layout and then condensed. Each condensed netlist represents a specific sub-circuit and accounts for performance variations (e.g., as a function of variations in operating power supply voltages, operating temperatures and, optionally, self-heating and/or stress) exhibited by the active devices and resistive network associated with that specific sub-circuit. The condensed netlists for all of the sub-circuits are then simulated over the full range of operating temperatures for the integrated circuit and over a full range of operating power supply voltages for the integrated circuit in order to generate a performance model for the integrated circuit with excellent accuracy (e.g., error <0.1%) in a significant reduced time (e.g., less than a minute).

What is claimed is:

1. An integrated circuit performance modeling system comprising:
   an integrated circuit layout analyzer segmenting a layout of an integrated circuit into a plurality of sub-circuits, each sub-circuit comprising a group of a given type of active devices sharing electrical sub-circuit terminals and being subjected to approximate equal parasitic resistances;
   a netlist extractor in communication with said analyzer and extracting, from said layout, full netlists corresponding to said sub-circuits;
   a netlist condenser in communication with said netlist extractor and condensing each full netlist corresponding to a specific sub-circuit into a condensed netlist for said specific sub-circuit, said condensed netlist comprising:
      a single active device of said given type; and
      a plurality of parameterizable resistors, each parameterizable resistor electrically connected to a corresponding terminal of said single active device; and
   a simulator in communication with said condenser and simulating all condensed netlists for all of said sub-circuits over a full range of operating temperatures for said integrated circuit and over a full range of operating power supply voltages for said integrated circuit in order to generate a performance model for said integrated circuit.

2. The system of claim 1, wherein said simulator further performing a first set of simulations of said full netlist over a single predetermined temperature and a plurality of predetermined power supply voltages, said plurality of predetermined power supply voltages being within said full range of operating power supply voltages for said integrated circuit;
   said condenser further condensing said full netlist by setting resistance parameters for said parameterizable resistors in said condensed netlist to match a first set of results from said first set of simulations;
   said simulator performing a second set of simulations of said full netlist over a plurality of predetermined temperatures and said plurality of predetermined power supply voltages, said plurality of predetermined temperatures being within said full range of operating temperatures for said integrated circuit; and
   said condenser further condensing said full netlist by setting a temperature coefficient for said condensed netlist to match a second set of results from said second set of simulations.

3. The system of claim 2, wherein said single active device comprising a field effect transistor and corresponding terminals comprising a source, a drain and a gate of said field effect transistor,
   said first set of results from said first set of simulations comprising values for any of constant linear overdrive current (Iodlin), linear drain current (Idlin), saturated drain current (Idsat) and gate current (Igate) for said field effect transistor, and
   said setting resistance parameters comprising setting any of:
      total source-drain parasitic resistance to achieve at least one of said constant linear overdrive current (Iodlin) and said linear drain current (Idlin);
      source parasitic resistance and drain parasitic resistance to achieve said saturated drain current (Idsat); and
      parasitic gate resistance to achieve said gate current (Igate).

4. The system of claim 2, wherein said simulator further performing a third set of simulations of said full netlist over said plurality of predetermined temperatures and said plurality of predetermined power supply voltages, said third set of simulations further considering self-heating of said active devices and resistors connected to said active devices;
   said condenser further condensing said first netlist by setting a self-heating coefficient for said condensed netlist to match a third set of results from said third set of simulations;
   said simulator further performing a fourth set of simulations of said full netlist over said plurality of predetermined temperatures and said plurality of predetermined power supply voltages, said fourth set of simulations further considering self-heating of said active devices and said resistors connected to said active devices and stress on at least one of said active devices and said resistors connected to said active devices; and
   said condenser further condensing said full netlist by setting at least one of stress parameters for said parameterizable resistors and said single active device, charge carrier mobility for said single active device and threshold voltage of said single active device to match a fourth set of results from said fourth set of simulations.

5. The system of claim 2, wherein said single predetermined temperature comprising a nominal temperature.

6. The system of claim 2, wherein said simulator further performing a final set of simulations of each of said full netlists over said full range of operating temperatures for said integrated circuit and said full range of operating power supply voltages for said integrated circuit in order to generate a second performance model for said integrated circuit; and
   said system further comprising a comparator comparing said performance model to said second performance model in order to verify an accuracy of said performance model.

7. The system of claim 1, wherein said active devices, which are essentially identical, comprising any one of essentially identical field effect transistors, essentially identical bipolar transistors, essentially identical heterojunction bipolar transistors, and essentially identical diodes.

8. A computer-implemented integrated circuit performance modeling method comprising:
   segmenting, by a computer system, a layout of an integrated circuit into a plurality of sub-circuits, each sub-circuit comprising a group of a given type of active devices sharing electrical sub-circuit terminals and being subjected to approximately equal parasitic resistances;
   extracting, from said layout by said computer system, full netlists corresponding to said sub-circuits;
   condensing, by said computer system, each full netlist corresponding to a specific sub-circuit into a condensed netlist for said specific sub-circuit, said condensed netlist comprising:

a single active device of said given type; and a plurality of parameterizable resistors, each parameterizable resistor electrically connected to a corresponding terminal of said single active device; and simulating, by said computer system, all condensed netlists for all of said sub-circuits over a full range of operating temperatures for said integrated circuit and over a full range of operating power supply voltages for said integrated circuit in order to generate a performance model for said integrated circuit.

9. The method of claim 8, wherein said condensing further comprising:

performing a first set of simulations of said full netlist over a single predetermined temperature and a plurality of predetermined power supply voltages, said plurality of predetermined power supply voltages being within said full range of operating power supply voltages for said integrated circuit;

setting resistance parameters of said parameterizable resistors in said condensed netlist to match a first set of results from said first set of simulations;

performing a second set of simulations of said full netlist over a plurality of predetermined temperatures and said plurality of predetermined power supply voltages, said plurality of predetermined temperatures being within said full range of operating temperatures for said integrated circuit; and setting a temperature coefficient for said condensed netlist to match a second set of results from said second set of simulations.

10. The method of claim 9, wherein said single active device comprising a field effect transistor and corresponding terminals comprising a source, a drain and a gate of said field effect transistor, said first set of results from said first set of simulations comprising values for any of constant linear overdrive current (Iodlin), linear drain current (Idlin), saturated drain current (Idsat) and gate current (Igate) for said field effect transistor, and said setting resistance parameters comprising setting any of:

total source-drain parasitic resistance to achieve at least one of said constant linear overdrive current (Iodlin) and said linear drain current (Idlin);

source parasitic resistance and drain parasitic resistance to achieve said saturated drain current (Idsat); and parasitic gate resistance to achieve said gate current (Igate).

11. The method of claim 9, wherein said condensing further comprising:

performing a third set of simulations of said full netlist over said plurality of predetermined temperatures and said plurality of predetermined power supply voltages, said third set of simulations further considering self-heating of said active devices and resistors connected to said active devices;

setting a self-heating coefficient for said condensed netlist to match a third set of results from said third set of simulations;

performing a fourth set of simulations of said full netlist over said plurality of predetermined temperatures and said plurality of predetermined power supply voltages, said fourth set of simulations further considering self-heating of said active devices and said resistors connected to said active devices and stress on at least one of said active devices and said resistors connected to said active devices; and setting at least one of stress parameters for said parameterizable resistors and said single active device, charge carrier mobility for said single active device and threshold voltage of said single active device to match a fourth set of results from said fourth set of simulations.

12. The method of claim 9, wherein said single predetermined temperature comprising a nominal temperature.

13. The method of claim 9, further comprising:

performing, by said computer system, a final set of simulations of each of said full netlists over said full range of operating temperatures for said integrated circuit and said full range of operating power supply voltages for said integrated circuit in order to generate a second performance model for said integrated circuit; and comparing, by said computer system, said performance model to said second performance model in order to verify an accuracy of said performance model.

14. The method of claim 8, wherein said active devices, which are essentially identical, comprising any one of essentially identical field effect transistors, essentially identical bipolar transistors, essentially identical heterojunction bipolar transistors, and essentially identical diodes.

15. A computer-implemented integrated circuit performance modeling method comprising:

segmenting, by a computer system, a layout of an integrated circuit into a plurality of sub-circuits, each sub-circuit comprising a group of a given type of active devices sharing electrical sub-circuit terminals and being subjected to approximately equal parasitic resistances;

extracting, from said layout by said computer system, full netlists corresponding to said sub-circuits;

condensing, by said computer system, each full netlist corresponding to a specific sub-circuit into a condensed netlist for said specific sub-circuit, said condensed netlist accounting for performance variations exhibited by all of said active devices in said group as a function of variations in operating power supply voltages, operating temperatures, self-heating and stress and comprising:

a single active device of said given type; and a plurality of parameterizable resistors, each parameterizable resistor electrically connected to a corresponding terminal of said single active device; and simulating, by said computer system, all condensed netlists for all of said sub-circuits over a full range of operating temperatures for said integrated circuit and over a full range of operating power supply voltages for said integrated circuit in order to generate a performance model for said integrated circuit.

16. The method of claim 15, wherein said condensing further comprising:

performing a first set of simulations of said full netlist over a single predetermined temperature and a plurality of predetermined power supply voltages, said plurality of predetermined power supply voltages being within said full range of operating power supply voltages for said integrated circuit;

setting resistance parameters of said parameterizable resistors in said condensed netlist to match a first set of results from said first set of simulations;

performing a second set of simulations of said full netlist over a plurality of predetermined temperatures and said plurality of predetermined power supply voltages, said plurality of predetermined temperatures being within said full range of operating temperatures for said integrated circuit;

setting a temperature coefficient for said condensed netlist to match a second set of results from said second set of simulations;

performing a third set of simulations of said full netlist over said plurality of predetermined temperatures and said plurality of predetermined power supply voltages, said third set of simulations further considering self-heating of said active devices and resistors connected to said active devices;

setting a self-heating coefficient for said condensed netlist to match a third set of results from said third set of simulations;

performing a fourth set of simulations of said full netlist over said plurality of predetermined temperatures and said plurality of predetermined power supply voltages, said third set of simulations further considering self-heating of said active devices and said resistors connected to said active devices and stress on at least one of said active devices and said resistors connected to said active devices; and setting at least one of stress parameters for said parameterizable resistors and said single active device, charge carrier mobility for said single active device and threshold voltage of said single active device to match a fourth set of results from said fourth set of simulations.

17. The method of claim 16, wherein said single predetermined temperature comprising a nominal temperature.

18. The method of claim 15, wherein said active devices, which are essentially identical, comprising any one of essentially identical field effect transistors, essentially identical bipolar transistors, essentially identical heterojunction bipolar transistors, and essentially identical diodes.

19. The method of claim 15, further comprising:
performing, by said computer system, a final set of simulations of each of said full netlists over said full range of operating temperatures for said integrated circuit and said full range of operating power supply voltages for said integrated circuit in order to generate a second performance model for said integrated circuit; and comparing, by said computer system, said performance model to said second performance model in order to verify an accuracy of said performance model.

20. A program storage device readable by a computer and tangibly embodying a program of instructions executable by said computer to perform an integrated circuit performance modeling method, said method comprising:
segmenting a layout of an integrated circuit into a plurality of sub-circuits, each sub-circuit comprising a group of a given type of active devices sharing electrical sub-circuit terminals and being subjected to approximately equal parasitic resistances;

extracting, from said layout, full netlists corresponding to said sub-circuits;

condensing each full netlist corresponding to a specific sub-circuit into a condensed netlist for said specific sub-circuit, said condensed netlist comprising:
a single active device of said given type; and
a plurality of parameterizable resistors, each parameterizable resistor electrically connected to a corresponding terminal of said single active device; and simulating all condensed netlists for all of said sub-circuits over a full range of operating temperatures for said integrated circuit and over a full range of operating power supply voltages for said integrated circuit in order to generate a performance model for said integrated circuit.

21. The program storage device of claim 20, wherein said condensing further comprising:
performing a first set of simulations of said full netlist over a single predetermined temperature and a plurality of predetermined power supply voltages, said plurality of predetermined power supply voltages being within said full range of operating power supply voltages for said integrated circuit;

setting resistance parameters of said parameterizable resistors in said condensed netlist to match a first set of results from said first set of simulations;

performing a second set of simulations of said full netlist over a plurality of predetermined temperatures and said plurality of predetermined power supply voltages, said plurality of predetermined temperatures being within said full range of operating temperatures for said integrated circuit; and setting a temperature coefficient for said condensed netlist to match a second set of results from said second set of simulations.

22. The program storage device of claim 21, wherein said single active device comprising a field effect transistor and corresponding terminals comprising a source, a drain and a gate of said field effect transistor,
said first set of results from said first set of simulations comprising values for any of constant linear overdrive current (Iodlin), linear drain current (Idlin), saturated drain current (Idsat) and gate current (Igate) for said field effect transistor, and said setting resistance parameters comprising setting any of:
total source-drain parasistic resistance to achieve at least one of said constant linear overdrive current (Iodlin) and said linear drain current (Idlin);
source parasitic resistance and drain parasitic resistance to achieve said saturated drain current (Idsat); and
parasitic gate resistance to achieve said gate current (Igate).

23. The program storage device of claim 21, wherein said condensing further comprising:
performing a third set of simulations of said full netlist over said plurality of predetermined temperatures and said plurality of predetermined power supply voltages, said third set of simulations further considering self-heating of said active devices and resistors connected to said active devices;

setting a self-heating coefficient for said condensed netlist to match a third set of results from said third set of simulations;

performing a fourth set of simulations of said full netlist over said plurality of predetermined temperatures and said plurality of predetermined power supply voltages, said fourth set of simulations further considering self-heating of said active devices and said resistors connected to said active devices and stress on at least one of said active devices and said resistors connected to said active devices; and setting at least one of stress parameters for said parameterizable resistors and said single active device, charge carrier mobility for said single active device and threshold voltage of said single active device to match a fourth set of results from said fourth set of simulations.

24. The program storage device of claim 20, wherein said active devices, which are essentially identical, comprising any one of essentially identical field effect transistors, essentially identical bipolar transistors, essentially identical heterojunction bipolar transistors, and essentially identical diodes.

25. The program storage device of claim 20, said method further comprising:

performing a final set of simulations of each of said full netlists over said full range of operating temperatures for said integrated circuit and said full range of operating power supply voltages for said integrated circuit in order to generate a second performance model for said integrated circuit; and comparing said performance model to said second performance model in order to verify an accuracy of said performance model.

* * * * *